United States Patent
Xu et al.

(10) Patent No.: US 10,211,873 B2
(45) Date of Patent: Feb. 19, 2019

(54) MOBILE TERMINAL AND REAR HOUSING FOR MOBILE TERMINAL

(71) Applicant: BOE TECHNOLOGY GROUP CO., LTD., Beijing (CN)

(72) Inventors: Jian Xu, Beijing (CN); Yongda Ma, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/653,087

(22) Filed: Jul. 18, 2017

(65) Prior Publication Data
US 2018/0062689 A1    Mar. 1, 2018

(30) Foreign Application Priority Data
Aug. 29, 2016    (CN) ............... 2016 2 0979555 U

(51) Int. Cl.
| | | |
|---|---|---|
| H04B 1/18 | (2006.01) |
| H04M 1/18 | (2006.01) |
| H04M 1/02 | (2006.01) |
| H04B 1/38 | (2015.01) |
| H04B 1/3888 | (2015.01) |
| H05K 5/00 | (2006.01) |

(52) U.S. Cl.
CPC ............ *H04B 1/3888* (2013.01); *H04B 1/18* (2013.01); *H04B 1/38* (2013.01); *H04M 1/0202* (2013.01); *H04M 1/0262* (2013.01); *H04M 1/18* (2013.01); *H05K 5/00* (2013.01); *H05K 5/0086* (2013.01)

(58) Field of Classification Search
CPC .......... H04B 1/3888; H04B 2001/3894; H04B 1/38; H05K 5/0086; H04M 1/18; H04M 1/0262; H04M 1/02
See application file for complete search history.

(56) References Cited

U.S. PATENT DOCUMENTS

| | | | |
|---|---|---|---|
| 5,738,954 A * | 4/1998 | Latella ................ | G06F 1/1616 429/123 |
| D571,721 S * | 6/2008 | Yang ..................... | D13/107 |
| 7,534,523 B2 * | 5/2009 | Ishihara .............. | H01M 2/1066 429/100 |
| 7,680,521 B2 * | 3/2010 | Kim ................... | G06K 19/0706 429/97 |
| 8,088,507 B2 * | 1/2012 | Su ....................... | H01M 2/1066 361/679.01 |
| 2006/0154136 A1 * | 7/2006 | Ge ...................... | H01M 2/1066 429/97 |
| 2015/0005042 A1 * | 1/2015 | Lee .................... | H04M 1/18 455/572 |
| 2016/0191101 A1 * | 6/2016 | Rayner ............... | G06F 1/163 455/575.8 |
| 2016/0294428 A1 * | 10/2016 | Li ....................... | H04B 1/3888 |
| 2016/0323004 A1 * | 11/2016 | Cho ................... | H04B 1/3888 |
| 2018/0029257 A1 * | 2/2018 | Surinya .............. | B29C 39/003 |

\* cited by examiner

*Primary Examiner* — Pablo N Tran
(74) *Attorney, Agent, or Firm* — Kinney & Lange, P.A.

(57) ABSTRACT

A mobile terminal includes a mobile terminal body; a rear housing which is mountable together with the mobile terminal body, a battery of the mobile terminal being provided on the rear housing; an isolation plate fixedly connected with the mobile terminal body and sealing a circuit element of the mobile terminal body, a battery interface being exposed from a side of the isolation plate facing the rear housing being, wherein the battery disposed on the rear housing is connectable electrically with the circuit element through the battery interface.

17 Claims, 5 Drawing Sheets

MOBILE TERMINAL AND REAR HOUSING FOR MOBILE TERMINAL

CROSS-REFERENCE TO RELATED APPLICATION

This application claims the benefit of the Chinese Patent Application No. 201620979555.X filed on Aug. 29, 2016 in the State Intellectual Property Office of China, the whole disclosure of which is incorporated herein by reference.

BACKGROUND

Technical Field

The present disclosure relates to the field of terminal technologies, and particularly, to a mobile terminal and a rear housing for the mobile terminal.

Description of the Related Art

With rapid development of communication technologies, a mobile terminal has been used by more and more people. A mobile terminal housing, as an important part of the mobile terminal to protect a mobile terminal body, has attracted considerable attention.

In the prior art, a mobile terminal housing includes a front frame and a rear housing, a display panel of the mobile terminal is embedded in the front frame, and the rear housing is jointed to the front frame, such that after disassembling the rear housing, circuit elements such as a circuit board, a chip set and the like arranged within the mobile terminal body, and a battery will be exposed.

The circuit elements and the battery will be exposed after disassembling the rear housing, thus when the mobile terminal falls off or other foreign matter (such as water or dust) enters the mobile terminal, the circuit elements and the battery will be easily damaged and thereby functions of the mobile terminal will be adversely affected, therefore the mobile terminal housing has a poorer protective property.

SUMMARY

In order to solve or eliminate at least one of above problems, the present disclosure provides a mobile terminal.

In an aspect, there is provided a mobile terminal, comprising:

a mobile terminal body;

a rear housing which is mountable together with the mobile terminal body, a battery of the mobile terminal being provided on the rear housing;

an isolation plate fixedly connected with the mobile terminal body and sealing a circuit element of the mobile terminal body, a battery interface being exposed from a side of the isolation plate facing the rear housing, wherein the battery disposed on the rear housing is connectable electrically with the circuit element through the battery interface.

In one example, a receiving groove is provided in a surface of the rear housing facing the mobile terminal body and configured for receiving the battery therein.

In one example, the receiving groove comprises a deformable groove.

In one example, the receiving groove comprises a receiving at least one rubber ring formed from a rubber gasket and configured to enclose the battery therein.

In one example, there is a single receiving rubber ring, or there are more than one receiving rubber rings.

In one example, the receiving rubber ring comprises a first blocking rubber ring and a second blocking rubber ring connected together, the first blocking rubber ring being in contact with a surface of the rear housing, the second blocking rubber ring being arranged at a side of the first blocking rubber ring facing away from the rear housing, a height of the first blocking rubber ring is equal to a thickness of the battery, and an area of a region surrounded by the first blocking rubber ring is less than an area of a region surrounded by the second blocking rubber ring.

In one example, a recess is provided in a surface of the isolation plate facing the rear housing and configured to receive the receiving groove and the battery therein, the battery interface being arranged on a side wall of the recess.

In one example, the battery interface is in a convex shape, and the side wall of the receiving groove is provided with a notch at a position corresponding to the battery interface, the battery interface being insertable into the notch to be electrically connected with the battery.

In one example, the rear housing is provided with a side frame, through which the rear housing is engaged onto the mobile terminal body.

In one example, an elastic element is provided at periphery on an inner wall of the side frame of the rear housing and located between the rear housing and the isolation plate.

In one example, the elastic element is made of a rubber gasket, and, the elastic element comprises a first sealing rubber gasket in contact with the isolation plate.

In one example, the elastic element further comprises a second sealing rubber gasket disposed between the first sealing rubber gasket and the isolation plate.

In one example, the inner wall of the side frame is provided with a plurality of engagement grooves, each of which is engageable with an engagement fastener provided on the mobile terminal body.

In one example, the inner wall of the side frame is provided with a plurality of engagement fasteners, each of which is engageable with an engagement groove provided in the mobile terminal body.

In one example, the isolation plate and the mobile terminal body are each provided with a screw hole, and the isolation plate is fixedly connected with the mobile terminal body via a screw which is allowed to pass through the screw hole.

In one example, the isolation plate is further provided with a plurality of depression structures, and the mobile terminal body is provided with projection structures configured to engage the plurality of depression structures.

In one example, the isolation plate is further provided with a plurality of projection structures, and the mobile terminal body is provided with depression structures configured to engage the plurality of projection structures.

In another aspect, it provides a rear housing for use in a mobile terminal, the rear housing being mountable together with a mobile terminal body of the mobile terminal, wherein the rear housing comprises a receiving groove for receiving a battery of the mobile terminal.

In one example, the receiving groove is made of a rubber gasket and configured to enclose the battery therein.

BRIEF DESCRIPTION OF THE DRAWINGS

In order to clearly describe technique schemes in embodiments of the present disclosure, accompanying drawings used for illustrating the embodiments will be simply described below. The accompanying drawings described below merely refer to some embodiments of the present disclosure.

DETAILED DESCRIPTION OF PREFERRED EMBODIMENTS

In order to make objects, technical solutions and advantages of the present disclosure more clear, embodiments of the present disclosure will be further described in detail hereinafter with reference to the accompanying drawings.

Figure 1:
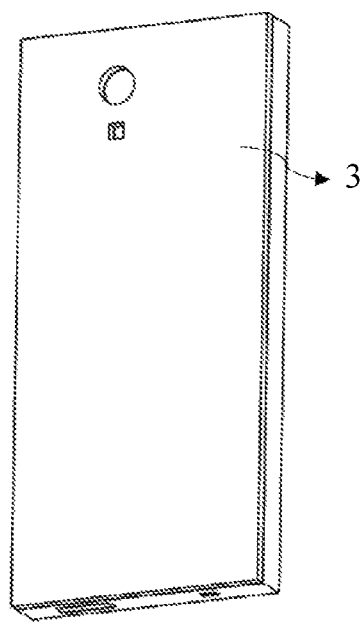
FIG. 1 is a rear view of a mobile terminal according to an embodiment of the present disclosure.
Figure 2:
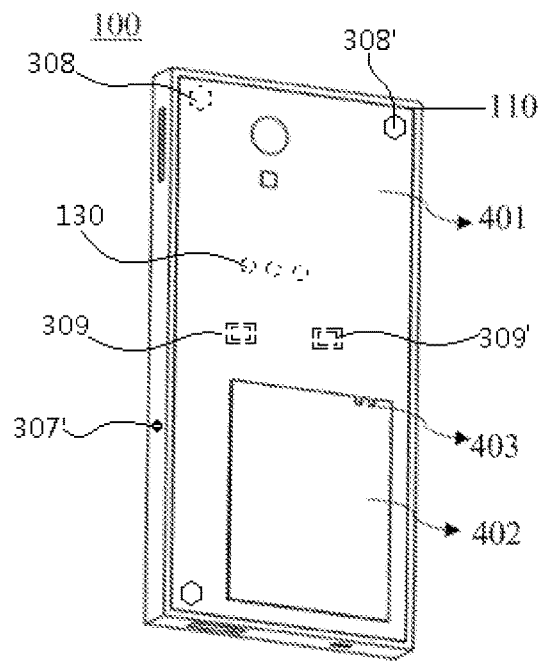
FIG. 2 is a rear view of a mobile terminal according to an embodiment of the present disclosure, with a rear housing being removed to show an isolation plate.

An embodiment of the present disclosure provides a mobile terminal 100, as shown in FIGS. 1 and 2. The mobile terminal 100 includes a mobile terminal body 110, a rear housing 3 and an isolation plate 401. The rear housing 3 is mountable with (in snap fit with) the mobile terminal body 110. A battery 120 of the mobile terminal 100 is provided on the rear housing 3.

Figure 3:
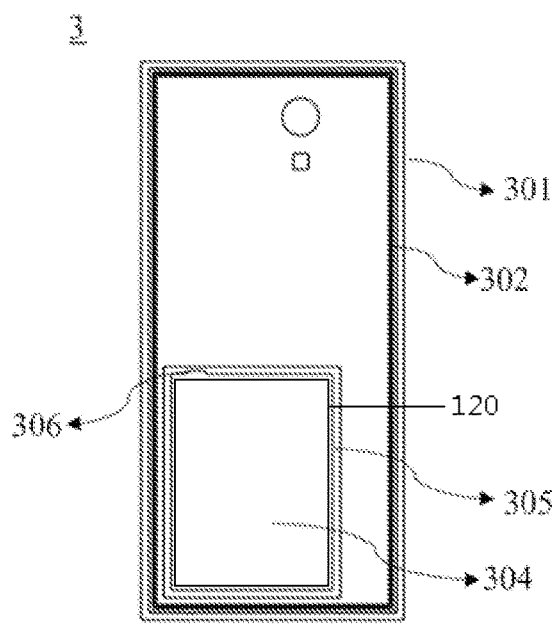
FIG. 3 is a structural schematic diagram of a rear housing according to an embodiment of the present disclosure.

As shown in FIG. 3, a receiving groove 304 is provided in a surface of the rear housing 3 facing towards the mobile terminal body 110 and configured for receiving the battery 120 therein.

As shown in FIG. 2, the isolation plate 401 is fixedly connected with the mobile terminal body 110 and seals a circuit element 130 of the mobile terminal body 110. The isolation plate 401 is arranged between the circuit element 130 of the mobile terminal body 110 and the rear housing 3. Only a battery interface 403 is exposed from a side of the isolation plate 401 facing the rear housing 3, wherein the battery 120 disposed on the rear housing 3 is connectable electrically with the circuit element 130 through the battery interface 403.

It is noted that FIG. 2 only schematically depicts several circuit elements 130, and it will be understood by those skilled in the art that the mobile terminal body 110 may include any number of circuit elements 120, which will not be illustrated herein.

As described above, with the mobile terminal provided in the embodiment of the present disclosure, the isolation plate 401 is arranged between the circuit element 130 and the rear housing 3 and the circuit element 130 is isolated from the outside through the isolation plate 401, such that after disassembling the rear housing 3, the circuit element 130 will not be exposed to the outside, and the battery 120 may be received in the receiving groove 304 of the rear housing 3. Compared to the prior art, it can avoid damage to the circuit element 130 and the battery 120, functions of the mobile terminal 100 will not be easily affected, and the protective property of the housing of the mobile terminal 100 is improved.

Figure 4:
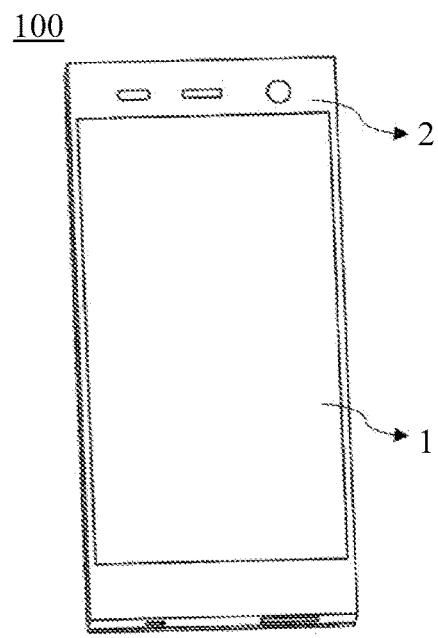
FIG. 4 is a front view of the mobile terminal shown in the FIG. 1 according to the embodiment of the present disclosure.

FIG. 4 shows a front view of a mobile terminal 100 provided with a display panel. In FIG. 4, the reference numeral "1" indicates the display panel, and the reference numeral "2" indicates a front frame.

In order to receive the battery 120 better and to prevent external moisture, dust and the like from entering the interior of the battery, optionally, the receiving groove 304 shown in FIG. 3 includes a deformable groove or is a deformable groove. The receiving groove 304 includes a receiving rubber ring 305 formed from a rubber gasket and configured to enclose the battery 120 therein.

The number of the receiving rubber rings 305 may be one or more.

The battery 120 generally has a rectangular or square shape, thus the receiving rubber ring 305 also has a rectangular or square shape.

Figure 5:
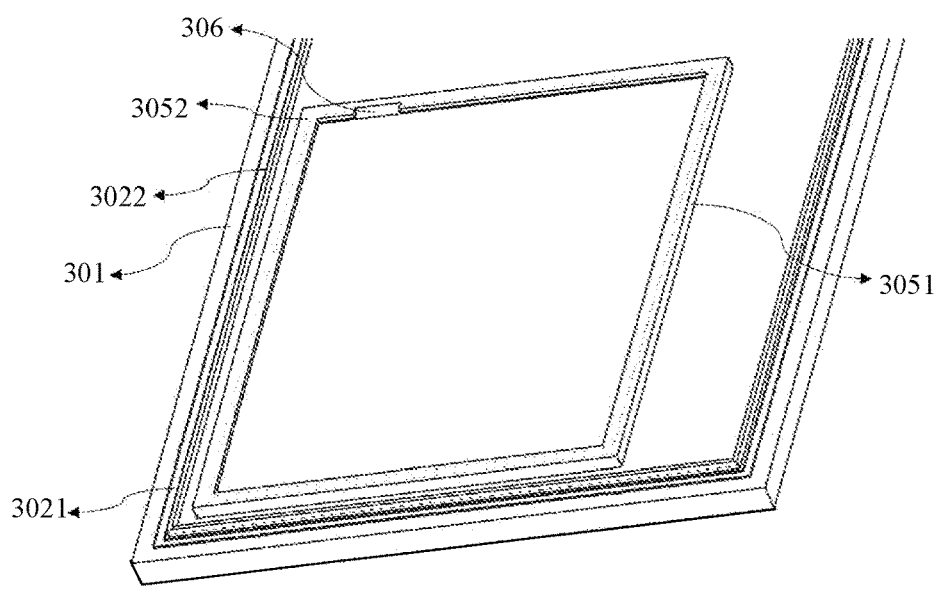
FIG. 5 is an enlarged structural schematic diagram of the rear housing shown in FIG. 3.

Optionally, as shown in FIG. 5, the receiving rubber ring 305 may include a first blocking rubber ring 3051 and a second blocking rubber ring 3052 connected together. The first blocking rubber ring 3051 is in contact with a housing surface of the rear housing 3, the second blocking rubber ring 3052 is arranged at a side of the first blocking rubber ring 3051 facing away from the rear housing 3. A height of the first blocking rubber ring 3051 is equal to a thickness of the battery 120. An area of a region surrounded by the first blocking rubber ring 3051 is less than an area of a region surrounded by the second blocking rubber ring 3052. The first blocking rubber ring 3051 and the second blocking rubber ring 3052 can provide further protection to the battery 120. The battery 120 is placed within the receiving groove 304, such that the first and second blocking rubber rings 3051, 3052 can enclose the battery 120 better. Since the battery 120 may be received in the receiving groove 304 of the rear housing 3, the mobile terminal 100 itself has a higher integration degree. The battery 120 is disposed on the rear housing 3, so it facilitates to replace the battery 120, and such arrangement is more convenient in use when compared to the one-piece mobile terminal where the rear housing 3 or the battery 120 could not be detached. Optionally, the first blocking rubber ring 3051 and the second blocking rubber ring 3052 may be formed as one piece. In FIG. 5, the reference numeral 306 denotes a notch, and the reference numeral 301 denotes a side frame.

It should be understood that in an example of the present disclosure, in a case that the height of the first blocking rubber ring 3051 is equal to the thickness of the battery 120, such arrangement will better enclose the battery 120 and contribute to reducing the overall thickness of the mobile terminal. Of course, the skilled person in the art can set the height of the first blocking rubber ring 3051 according to actual requirements.

Figure 6:
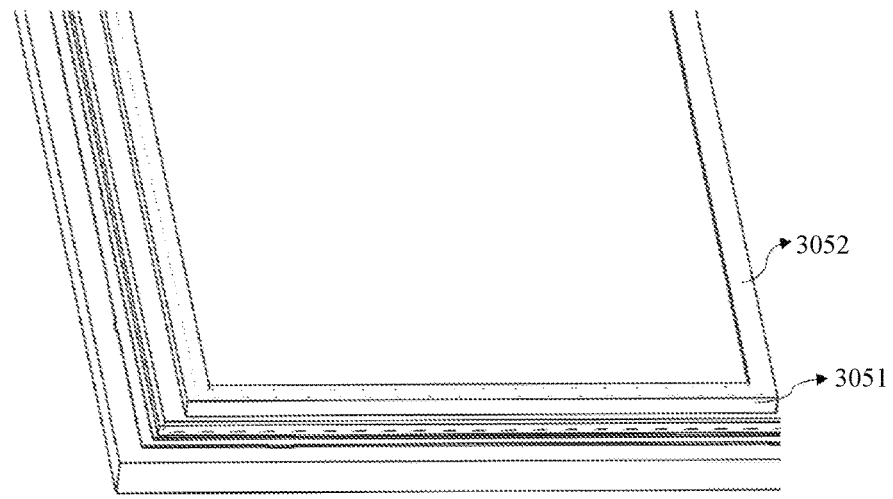
FIG. 6 is an enlarged structural schematic diagram of a receiving groove shown in FIG. 3.

FIG. 6 shows an enlarged schematic diagram of the first blocking rubber ring 3051 and the second blocking rubber ring 3052. In an example, the second blocking rubber ring 3052 is disposed on a side of the first blocking rubber ring 3051 facing away from the rear housing 3, and an area of a region surrounded by the first blocking rubber ring 3051 is less than an area of a region surrounded by the second blocking rubber ring 3052.

Further, as shown in FIG. 2, a recess 402 is provided in a surface of the isolation plate 401 facing the rear housing 3 and configured to receive the receiving groove 304 (as shown in FIG. 3) and the battery 120, and the battery interface 403 is arranged on a side wall of the recess 402. The recess 402 is provided in the isolation plate 401, and the battery interface 403 is arranged on the side wall of the recess 402, such that it facilitates an electrical connection between the battery 120 and the circuit element 130 of the mobile terminal body 110.

As shown in FIG. 2, the battery interface 403 is in a convex shape or a raised structure. As shown in FIG. 3, the side wall of the receiving groove 304 is provided with a notch 306 at a position corresponding to the battery interface 403, and the battery interface 403 is insertable into the notch 306 to be electrically connected with the battery 120, such that the battery 120 can be in connection with the circuit element 130 of the mobile terminal body 110 through the battery interface 403.

Figure 7:
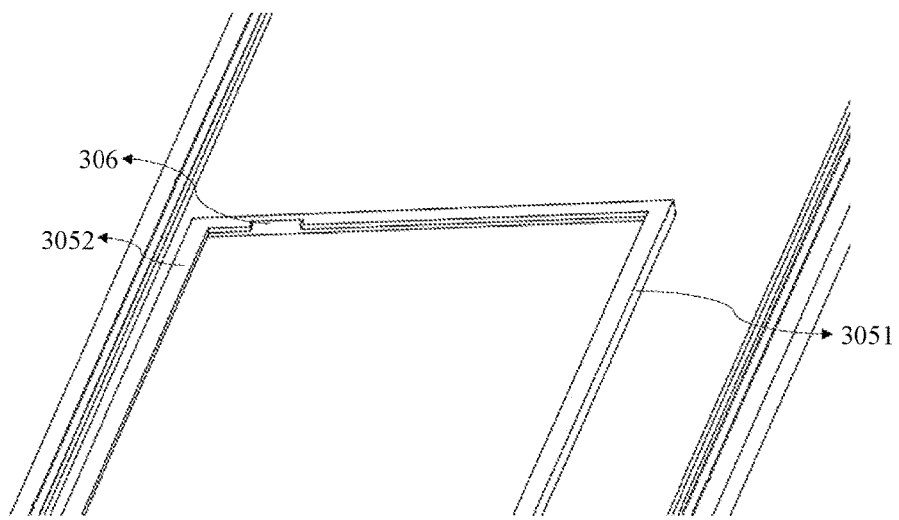
FIG. 7 is an enlarged schematic diagram of a notch in a side wall of the receiving groove shown in FIG. 3.

FIG. 7 shows an enlarged schematic diagram of the notch 306 in the side wall of the receiving groove 304. The position of the notch 306 corresponds to the position of the battery interface 403 on the side wall of the recess 304 of the isolation plate 401. The battery interface 403 can be inserted into the notch 306 to be electrically connected with the battery 120. In FIG. 7, the reference numeral 3051 denotes the first blocking rubber ring, and the reference numeral 3052 denotes the second blocking rubber ring.

As shown in FIG. 3, the rear housing 3 is provided with a side frame 301, through which the rear housing 3 is engaged onto or snap fitted with the mobile terminal body 120.

Further, as shown in FIG. 3, an elastic element 302 is provided at periphery of an inner wall of the side frame 301 of the rear housing 3 and located between the rear housing 3 and the isolation plate 401. The elastic element 302 is arranged between the rear housing 3 and the isolation plate 401, thus it can prevent external moisture, dust and the like from entering the interior of the mobile terminal.

Optionally, the elastic element 302 is made of a rubber gasket, and as shown in FIG. 5, the elastic element 302 includes a first sealing rubber gasket 3021 in contact with the isolation plate 401. The first sealing rubber gasket 3021 functions to enhance sealing between the rear housing 3 and the isolation plate 401.

Further, as shown in FIG. 5, the elastic element 302 further includes a second sealing rubber gasket 3022 disposed between the first sealing rubber gasket 3021 and the isolation plate 401. The second sealing rubber gasket 3022 can further enhance sealing between the rear housing 3 and the isolation plate 401. When mounting the rear housing 3 onto the mobile terminal body 120, the first sealing rubber gasket 3021 and the second sealing rubber gasket 3022 are together pressed to abut against the isolation plate 401, thereby it can prevent external moisture, dust and the like from entering the interior of the mobile terminal. Optionally, the first sealing rubber gasket 3021 and the second sealing rubber gasket 3022 are formed into one-piece.

Figure 8:
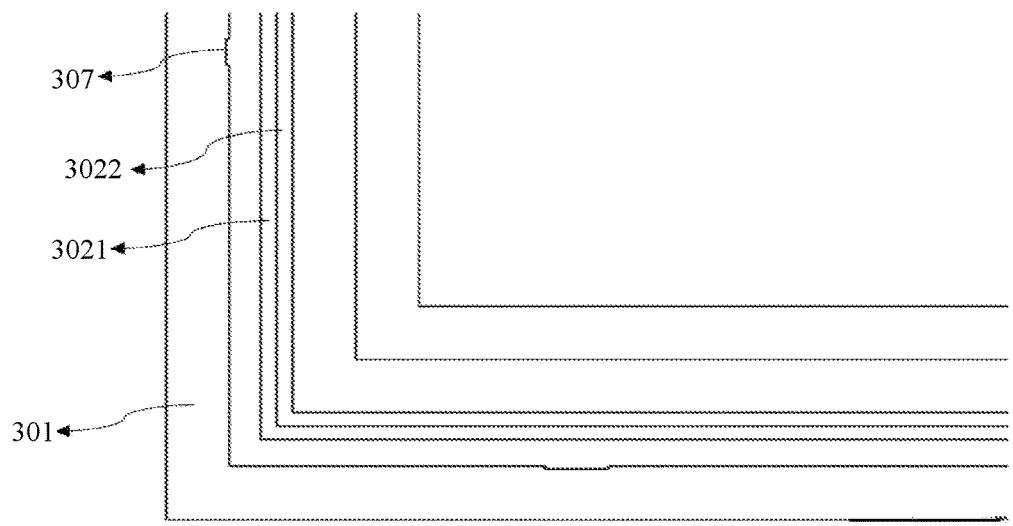
FIG. 8 is a structural schematic diagram of an engagement groove provided in an inner wall of a side frame shown in FIG. 3.

Further, in order that the rear housing 3 is engaged with the mobile terminal body 120 better, as shown in FIG. 8, the inner wall of the side frame 301 is provided with a plurality of engagement grooves 307, each of which is engageable with an engagement fastener 307' provided on the mobile terminal body 110. In FIG. 8, the reference numeral 3021 denotes the first sealing rubber gasket, and the reference numeral 3022 denotes the second sealing rubber gasket.

Alternatively, the inner wall of the side frame 301 may be provided with a plurality of engagement fasteners, each of which is engageable with an engagement groove provided in the mobile terminal body 110.

In order to fixedly connect the isolation plate 401 with the mobile terminal body 110, exemplarily, the isolation plate 401 and the mobile terminal body 110 may be each provided with a screw hole 308, and the isolation plate 401 is fixedly connected with the mobile terminal body 110 via a screw 308' which is allowed to pass through the screw holes 308. The screw hole 308 may be arranged at a corner of the mobile terminal body 110.

In addition, the isolation plate 401 may be fixedly connected with the mobile terminal body 110 by using both screw fixing connection and snap-fit fixing connection. Exemplarily, the isolation plate 401 may be further provided with a plurality of depression structures 309, and the mobile terminal body 110 is provided with projection structures 309' configured to engage the plurality of depression structures 309. Alternatively, the isolation plate 401 may be further provided with a plurality of projection structures, and the mobile terminal body 110 is provided with depression structures configured to engage the plurality of projection structures. The plurality of depression structures and the plurality of projection structures are provided such that the isolation plate can be engaged with the mobile terminal body 110.

The battery and the rear housing of the mobile terminal in embodiments of the present disclosure may be provided as a whole, and when the rear housing receiving the battery therein is mounted onto the mobile terminal body, the battery can be in electrical connection with the circuit element through the battery interface of the isolation plate. When the rear housing is detached from the mobile terminal body, only the battery interface for connecting the battery and the circuit element is exposed to the outside. As can be seen, the mobile terminal can achieves effects such as detachable battery, preventing external moisture, dust and the like from entering the interior of mobile terminal, when compared to mobile terminals in prior arts.

In sum, with the mobile terminal provided in embodiments of the present disclosure, the isolation plate is arranged between the circuit element and the rear housing, thus the circuit element will not be exposed to the outside after disassembling the rear housing, and the battery may be received in the receiving groove of the rear housing. Compared to prior arts, it can avoid damage to the circuit element and the battery, functions of the mobile terminal will not easily affected, the protective property of the housing of the mobile terminal is improved, and the structure of the mobile terminal is simple and easy to be implemented.

The above description is merely exemplary embodiments of the present disclosure, and is not intended to limit the present disclosure. Changes, alternatives, or modifications made within the spirit and principle of the present disclosure by those skilled in the art shall be included in the scopes of the present disclosure.

What is claimed is:
1. A mobile terminal comprising:
a mobile terminal body comprising: a front frame having a rear opening; and a circuit element in the front frame;
a rear housing which is mountable together with the mobile terminal body, a battery of the mobile terminal being provided on the rear housing;
an isolation plate fixedly connected with the mobile terminal body and sealing the rear opening of the front frame of the mobile terminal body so that the circuit element is located on a front side of the isolation plate, a battery interface being disposed on a surface of the isolation plate facing the rear housing, wherein the battery provided on the rear housing is connectable electrically with the circuit element through the battery interface.

2. The mobile terminal according to claim 1, wherein
a receiving groove is provided in a surface of the rear housing facing the mobile terminal body and configured for receiving the battery therein.

3. The mobile terminal according to claim 2, wherein the receiving groove comprises a deformable groove.

4. The mobile terminal according to claim 3, wherein the receiving groove comprises at least one receiving rubber ring formed from a rubber gasket and configured to enclose the battery therein.

5. The mobile terminal according to claim 4, wherein the at least one receiving rubber ring is a single receiving rubber ring.

6. The mobile terminal according to claim 4, wherein the at least one receiving rubber ring comprises a first blocking rubber ring and a second blocking rubber ring connected together, the first blocking rubber ring being in contact with the surface of the rear housing, the second blocking rubber ring being arranged at a side of the first blocking rubber ring facing away from the rear housing, and wherein a height of the first blocking rubber ring is equal to a thickness of the battery, and wherein an area of a region surrounded by the first blocking rubber ring is less than an area of a region surrounded by the second blocking rubber ring.

7. The mobile terminal according to claim 2, wherein
a recess is provided in a surface of the isolation plate facing the rear housing and configured to receive the receiving groove and the battery therein, the battery interface being arranged on a side wall of the recess.

8. The mobile terminal according to claim 7, wherein the battery interface is a convex shape, and
a side wall of the receiving groove is provided with a notch at a position corresponding to the battery interface, the battery interface being insertable into the notch to be electrically connected with the battery.

9. The mobile terminal according to claim 1, wherein
the rear housing is provided with a side frame, through which the rear housing is engaged onto the mobile terminal body.

10. The mobile terminal according to claim 9, wherein
an elastic element is provided at periphery of an inner wall of the side frame of the rear housing and located between the rear housing and the isolation plate.

11. The mobile terminal according to claim 10, wherein the elastic element is made of a rubber gasket, and the elastic element comprises a first sealing rubber gasket in contact with the isolation plate.

12. The mobile terminal according to claim 11, wherein
the elastic element further comprises a second sealing rubber gasket disposed between the first sealing rubber gasket and the isolation plate.

13. The mobile terminal according to claim 10, wherein
the inner wall of the side frame is provided with a plurality of engagement grooves, each of which is engageable with an engagement fastener provided on the mobile terminal body.

14. The mobile terminal according to claim 10, wherein the inner wall of the side frame is provided with a plurality of engagement fasteners, each of which is engageable with an engagement groove provided in the mobile terminal body.

15. The mobile terminal according to claim 1, wherein
the isolation plate and the mobile terminal body are each provided with a screw hole, and the isolation plate is fixedly connected with the mobile terminal body via a screw which is allowed to pass through the screw hole.

16. The mobile terminal according to claim 1, wherein
the isolation plate is further provided with a plurality of depression structures, and the mobile terminal body is provided with projection structures configured to engage the plurality of depression structures.

17. The mobile terminal according to claim 1, wherein the isolation plate is further provided with a plurality of projection structures, and the mobile terminal body is provided with depression structures configured to engage the plurality of projection structures.

* * * * *